(12) United States Patent
Hung et al.

(10) Patent No.: US 10,784,423 B2
(45) Date of Patent: Sep. 22, 2020

(54) LIGHT EMITTING DEVICE

(71) Applicant: Genesis Photonics Inc., Tainan (TW)

(72) Inventors: Cheng-Wei Hung, Tainan (TW); Chin-Hua Hung, Tainan (TW); Xun-Xain Zhan, Tainan (TW); Chuan-Yu Liu, Tainan (TW); Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 16/180,071

(22) Filed: Nov. 5, 2018

(65) Prior Publication Data
US 2019/0165232 A1 May 30, 2019

Related U.S. Application Data

(60) Provisional application No. 62/581,758, filed on Nov. 5, 2017.

(51) Int. Cl.
| | | |
|---|---|---|
| *H01L 33/62* | (2010.01) | |
| *H01L 33/64* | (2010.01) | |
| *H01L 33/50* | (2010.01) | |
| *H01L 25/075* | (2006.01) | |

(52) U.S. Cl.
CPC .......... *H01L 33/62* (2013.01); *H01L 25/0753* (2013.01); *H01L 33/50* (2013.01); *H01L 33/64* (2013.01); *H01L 33/642* (2013.01)

(58) Field of Classification Search
CPC ..... H01L 33/62; H01L 25/0753; H01L 33/50; H01L 33/64; H01L 33/642; H01L 33/0004–648
See application file for complete search history.

(56) References Cited

U.S. PATENT DOCUMENTS

| | | | |
|---|---|---|---|
| 6,155,699 A | 12/2000 | Miller et al. | |
| 6,919,586 B2 | 7/2005 | Fujii | |
| 7,045,828 B2 | 5/2006 | Shimizu et al. | |
| 7,190,004 B2 | 3/2007 | Nagai et al. | |
| 7,888,691 B2 | 2/2011 | Krames | |

(Continued)

FOREIGN PATENT DOCUMENTS

| | | |
|---|---|---|
| CN | 1674316 A | 9/2005 |
| CN | 1971957 A | 5/2007 |

(Continued)

OTHER PUBLICATIONS

TIPO Office Action dated Jun. 11, 2019 in Taiwan application (No. 107117295).

(Continued)

*Primary Examiner* — Cuong B Nguyen
(74) *Attorney, Agent, or Firm* — McClure, Qualey & Rodack, LLP (57) ABSTRACT

A light emitting device including a first light emitting unit, a second light emitting unit, a heat dissipation substrate, a plurality of first bumps and a plurality of second bumps is provided. The heat dissipation substrate is disposed between the first light emitting unit and the second light emitting unit. The first bumps are connected between the first light emitting unit and the heat dissipation substrate. The second bumps are connected between the second light emitting unit and the heat dissipation substrate.

20 Claims, 8 Drawing Sheets

(56) References Cited

U.S. PATENT DOCUMENTS

| | | | |
|---|---|---|---|
| 8,288,789 B2 | 10/2012 | Hung et al. | |
| 8,350,283 B2 | 1/2013 | Nishiuchi et al. | |
| 8,362,515 B2 | 1/2013 | Cheng et al. | |
| 8,461,610 B2 | 6/2013 | Ito et al. | |
| 8,482,016 B2 | 7/2013 | Harada | |
| 8,523,626 B2 | 9/2013 | Suehiro | |
| 8,552,444 B2 | 10/2013 | Ide et al. | |
| 8,552,453 B2 | 10/2013 | Takine | |
| 8,723,167 B2 | 5/2014 | Sato et al. | |
| 8,766,281 B2 | 7/2014 | Kao | |
| 8,771,577 B2 | 7/2014 | Basin et al. | |
| 8,860,061 B2 | 10/2014 | Kotani | |
| 8,877,528 B2 | 11/2014 | Ooyabu et al. | |
| 8,890,188 B2 | 11/2014 | Park et al. | |
| 8,957,434 B2 | 2/2015 | Sugizaki et al. | |
| 8,987,774 B2 | 3/2015 | Oyamada | |
| 9,006,763 B2 | 4/2015 | Ueno et al. | |
| 9,022,828 B2 | 5/2015 | Imai | |
| 9,029,893 B2 | 5/2015 | Akimoto et al. | |
| 9,065,033 B2 | 6/2015 | Lee et al. | |
| 9,337,405 B2 | 5/2016 | Yamada et al. | |
| 9,406,847 B2 | 8/2016 | Markytan et al. | |
| 9,419,189 B1 | 8/2016 | David et al. | |
| 9,490,398 B2 | 11/2016 | Oyamada et al. | |
| 9,887,329 B2 | 2/2018 | Yamada | |
| 9,922,963 B2 | 3/2018 | Hung et al. | |
| 2003/0006509 A1 | 1/2003 | Suzuki et al. | |
| 2003/0067070 A1 | 4/2003 | Kwon et al. | |
| 2004/0119402 A1 | 6/2004 | Shiang et al. | |
| 2004/0239242 A1* | 12/2004 | Mano | F21V 5/04 313/512 |
| 2005/0045897 A1 | 3/2005 | Chou et al. | |
| 2005/0219835 A1 | 10/2005 | Nagayama | |
| 2006/0055309 A1 | 3/2006 | Ono et al. | |
| 2006/0169994 A1 | 8/2006 | Tu et al. | |
| 2006/0186427 A1 | 8/2006 | Takine et al. | |
| 2007/0012940 A1 | 1/2007 | Suh et al. | |
| 2007/0114552 A1 | 5/2007 | Jang et al. | |
| 2007/0236940 A1 | 10/2007 | Kuroda et al. | |
| 2008/0123024 A1 | 5/2008 | Han et al. | |
| 2008/0150119 A1 | 6/2008 | Jang et al. | |
| 2009/0242917 A1 | 10/2009 | Inoue et al. | |
| 2009/0296389 A1 | 12/2009 | Hsu | |
| 2010/0052001 A1 | 3/2010 | Li et al. | |
| 2010/0066236 A1 | 3/2010 | Xu et al. | |
| 2010/0117530 A1 | 5/2010 | Lin et al. | |
| 2010/0258419 A1 | 10/2010 | Chung et al. | |
| 2010/0258830 A1 | 10/2010 | Ide et al. | |
| 2011/0001157 A1 | 1/2011 | McKenzie et al. | |
| 2011/0018017 A1 | 1/2011 | Bierhuizen et al. | |
| 2011/0025190 A1 | 2/2011 | Jagt | |
| 2011/0079805 A1 | 4/2011 | Yu et al. | |
| 2011/0102883 A1 | 5/2011 | Narendran et al. | |
| 2011/0170303 A1 | 7/2011 | Wu et al. | |
| 2011/0198780 A1 | 8/2011 | Basin et al. | |
| 2011/0297980 A1 | 12/2011 | Sugizaki et al. | |
| 2011/0309398 A1 | 12/2011 | Ito et al. | |
| 2012/0025218 A1 | 2/2012 | Ito et al. | |
| 2012/0025247 A1 | 2/2012 | Ooyabu et al. | |
| 2012/0061700 A1 | 3/2012 | Eder et al. | |
| 2012/0077292 A1 | 3/2012 | Chang et al. | |
| 2012/0161164 A1 | 6/2012 | Kim | |
| 2012/0181569 A1 | 7/2012 | Choi | |
| 2012/0223351 A1 | 9/2012 | Margalit | |
| 2012/0235126 A1 | 9/2012 | Yamazaki et al. | |
| 2012/0236582 A1 | 9/2012 | Waragaya et al. | |
| 2012/0250320 A1 | 10/2012 | Harbers et al. | |
| 2012/0261689 A1 | 10/2012 | Appelt et al. | |
| 2012/0261700 A1 | 10/2012 | Ooyabu et al. | |
| 2012/0305942 A1 | 12/2012 | Lo et al. | |
| 2013/0001605 A1 | 1/2013 | Ishihara et al. | |
| 2013/0037842 A1 | 2/2013 | Yamada et al. | |
| 2013/0093313 A1 | 4/2013 | Oyamada | |
| 2013/0105978 A1 | 5/2013 | Hung | |
| 2013/0121000 A1 | 5/2013 | Lee et al. | |
| 2013/0194794 A1 | 8/2013 | Kim | |
| 2013/0207141 A1 | 8/2013 | Reiherzer | |
| 2013/0207142 A1 | 8/2013 | Reiherzer | |
| 2013/0256711 A1 | 10/2013 | Joo et al. | |
| 2013/0277093 A1 | 10/2013 | Sun et al. | |
| 2013/0285091 A1* | 10/2013 | Akimoto | H01L 33/44 257/98 |
| 2013/0313594 A1 | 11/2013 | Han et al. | |
| 2014/0001504 A1 | 1/2014 | Hou-Te | |
| 2014/0009060 A1 | 1/2014 | Kimura et al. | |
| 2014/0021493 A1 | 1/2014 | Andrews et al. | |
| 2014/0042481 A1 | 2/2014 | Inoue et al. | |
| 2014/0054621 A1 | 2/2014 | Seko | |
| 2014/0117396 A1 | 5/2014 | Eisert et al. | |
| 2014/0124812 A1 | 5/2014 | Kuramoto et al. | |
| 2014/0131753 A1 | 5/2014 | Ishida et al. | |
| 2014/0138725 A1 | 5/2014 | Oyamada | |
| 2014/0153238 A1 | 6/2014 | Nishimura et al. | |
| 2014/0186979 A1 | 7/2014 | Tu et al. | |
| 2014/0203451 A1 | 7/2014 | Kwon et al. | |
| 2014/0252389 A1 | 9/2014 | Koizumi et al. | |
| 2015/0014720 A1 | 1/2015 | Tien | |
| 2015/0102373 A1 | 4/2015 | Lee et al. | |
| 2015/0102377 A1 | 4/2015 | Huang et al. | |
| 2015/0115300 A1 | 4/2015 | Tomizawa et al. | |
| 2015/0179901 A1 | 6/2015 | Ok et al. | |
| 2015/0188004 A1 | 7/2015 | Ozeki et al. | |
| 2015/0200338 A1 | 7/2015 | Kim et al. | |
| 2015/0263242 A1 | 9/2015 | Tomizawa et al. | |
| 2015/0280078 A1 | 10/2015 | Yen et al. | |
| 2015/0311405 A1 | 10/2015 | Oyamada et al. | |
| 2016/0013373 A1 | 1/2016 | Bhat et al. | |
| 2016/0035952 A1 | 2/2016 | Yamada et al. | |
| 2016/0079496 A1 | 3/2016 | Huang et al. | |
| 2016/0155900 A1 | 6/2016 | Bono et al. | |
| 2016/0155915 A1 | 6/2016 | Ling et al. | |
| 2016/0181476 A1 | 6/2016 | Chang et al. | |
| 2016/0190406 A1 | 6/2016 | Liu et al. | |
| 2016/0276320 A1 | 9/2016 | Hung et al. | |
| 2016/0276546 A1 | 9/2016 | Lee et al. | |
| 2016/0276547 A1 | 9/2016 | Hung et al. | |
| 2017/0005238 A1 | 1/2017 | Hung et al. | |
| 2018/0123001 A1 | 5/2018 | Hung et al. | |
| 2018/0138378 A1 | 5/2018 | Hung et al. | |

FOREIGN PATENT DOCUMENTS

| | | |
|---|---|---|
| CN | 101515621 A | 8/2009 |
| CN | 101867003 A | 10/2010 |
| CN | 101878540 A | 11/2010 |
| CN | 102074639 A | 5/2011 |
| CN | 102132428 A | 7/2011 |
| CN | 201910421 U | 7/2011 |
| CN | 102222757 A | 10/2011 |
| CN | 102263194 A | 11/2011 |
| CN | 102315354 A | 1/2012 |
| CN | 102468417 A | 5/2012 |
| CN | 102738368 A | 10/2012 |
| CN | 103050601 A | 4/2013 |
| CN | 103137571 A | 6/2013 |
| CN | 103199183 A | 7/2013 |
| CN | 103531725 A | 1/2014 |
| CN | 103534822 A | 1/2014 |
| CN | 1366715 | 5/2014 |
| CN | 1624944 | 5/2014 |
| CN | 1971957 | 5/2014 |
| CN | 101855735 | 5/2014 |
| CN | 101978516 | 5/2014 |
| CN | 102074639 | 5/2014 |
| CN | 102130071 | 5/2014 |
| CN | 102214623 | 5/2014 |
| CN | 102290500 | 5/2014 |
| CN | 102347423 | 5/2014 |
| CN | 102804426 | 5/2014 |
| CN | 103022010 | 5/2014 |
| CN | 103403890 | 5/2014 |
| CN | 103682038 | 5/2014 |
| CN | 104347610 | 5/2014 |
| CN | 203774363 U | 8/2014 |

(56) References Cited

FOREIGN PATENT DOCUMENTS

| | | |
|---|---|---|
| CN | 201541674 U | 10/2014 |
| CN | 104253194 A | 12/2014 |
| CN | 104347610 A | 2/2015 |
| CN | 204155931 U | 2/2015 |
| CN | 104521015 A | 4/2015 |
| JP | 2011114093 | 6/2011 |
| JP | 2012227470 A | 11/2012 |
| JP | 20120227470 | 5/2014 |
| TW | 200841089 A | 10/2008 |
| TW | 200929615 A | 7/2009 |
| TW | 201017934 A | 5/2010 |
| TW | 201114072 A | 4/2011 |
| TW | 201133956 A | 10/2011 |
| TW | 201210819 A | 3/2012 |
| TW | 201218428 A1 | 5/2012 |
| TW | 201220534 A | 5/2012 |
| TW | 201220560 A1 | 5/2012 |
| TW | 201242108 A | 10/2012 |
| TW | 201249898 A | 12/2012 |
| TW | 201308691 A1 | 2/2013 |
| TW | 201319460 A1 | 5/2013 |
| TW | M453969 U1 | 5/2013 |
| TW | 201401565 A | 1/2014 |
| TW | 201403873 A | 1/2014 |
| TW | 201507209 A | 2/2015 |
| TW | 201515282 A | 4/2015 |
| TW | 201541674 A | 11/2015 |
| WO | 2011/093454 | 8/2011 |

OTHER PUBLICATIONS

TIPO Office Action dated Jun. 18, 2019 in Taiwan application (No. 105108594).
TIPO Office Action dated Jun. 28, 2019 in Taiwan application (No. 105104666).
Notice of Allowance issued in U.S. Appl. No. 15/823,480, filed Nov. 27, 2017, dated Apr. 12, 2019.
CN Office Action dated Dec. 3, 2018 in Chinese application (No. 201610157182.2).
CN Office Action dated Dec. 4, 2018 in Chinese application (No. 201610089097.7).
CN Office Action dated Jan. 22, 2019 in Chinese application (No. 201610293182.5).
CN Office Action dated Mar. 21, 2019 in Chinese application (No. 201610830051.6).
CN Office Action dated Nov. 28, 2018 in Chinese application (No. 201610156784.6).
TIPO Office Action dated Dec. 6, 2018 in Taiwan application (No. 107119063).
Non-Final Office Action issued in U.S. Appl. No. 15/823,480, filed Nov. 27, 2017, dated Dec. 31, 2018.
Chinese Office Action dated Sep. 27, 2019 in Chinese application (No. 20161083005136).
Taiwan Intellectual Property Office Action dated Dec. 25, 2019, issued in Taiwan application No. 10821229200.
Chinese Office Action dated Dec. 25, 2019, issued in Chinese application No. 201910110303.1.
Taiwan Office Action dated Nov. 7, 2019, issued in application No. 10821057660.
U.S. Office Action dated Nov. 12, 2019, issued in U.S. Appl. No. 16/595,414.
Chinese language office action dated Nov. 17, 2016, issued in application No. TW 104144809.
Office action dated Nov. 4, 2016, issued in U.S. Appl. No. 15/168,218.
Chinese language office action dated Sep. 20, 2018, issued in application No. TW 104125226.
Chinese language office action dated Oct. 5, 2018, issued in application No. TW 104131083.
Chinese language office action dated Dec. 22, 2016, issued in application No. TW 105126842.
Office action dated Aug. 20, 2015, issued in U.S. Appl. No. 14/462,581.
Office action dated Dec. 16, 2016, issued in U.S. Appl. No. 14/711,798.
Office action dated Feb. 22, 2017, issued in U.S. Appl. No. 15/045,471.
Office action dated Oct. 25, 2016, issued in U.S. Appl. No. 15/045,471.
Office action dated Mar. 10, 2017, issued in U.S. Appl. No. 15/073,672.
Office action dated Mar. 31, 2017, issued in U.S. Appl. No. 15/073,673.
Office action dated Oct. 2, 2018, issued in U.S. Appl. No. 15/657,299.
Office action dated Oct. 18, 2018, issued in U.S. Appl. No. 15/787,811.
Office action dated Aug. 10, 2018, issued in U.S. Appl. No. 15/881,802.
Office action dated Sep. 27, 2018, issued in U.S. Appl. No. 16/004,445.
Chinese language office action dated May 22, 2017, issued in application No. CN 201410362787.6.
Chinese language office action dated Nov. 14, 2017, issued in application No. CN 201410362787.6.
Chinese language office action dated Aug. 10, 2017, issued in application No. TW 106108220.
Chinese language office action dated Jan. 9, 2018, issued in application No. TW 106135995.
Office action dated Jul. 28, 2017, issued in U.S. Appl. No. 14/711,798.
Office action dated Jan. 25, 2017, issued in U.S. Appl. No. 14/542,657.
Office action dated May 6, 2016, issued in U.S. Appl. No. 14/542,657.
Office action dated Oct. 7, 2015, issued in U.S. Appl. No. 14/542,657.
Office action dated Sep. 29, 2017, issued in U.S. Appl. No. 14/542,657.
Office action dated May 24, 2017, issued in U.S. Appl. No. 15/073,715.
Office action dated Jun. 15, 2017, issued in U.S. Appl. No. 15/268,654.
Office action dated Feb. 7, 2017, issued in U.S. Appl. No. 15/268,681.
Chinese language office action dated Apr. 20, 2018, issued in application No. CN 201410362787.6.
Chinese language office action dated Apr. 27, 2018, issued in application No. CN 201510244596.4.
Chinese language office action dated Jan. 16, 2018, issued in application No. TW 106131096.
Office action dated Feb. 8, 2018, issued in U.S. Appl. No. 15/073,673.
Office action dated May 1, 2017, issued in U.S. Appl. No. 15/073,707.
Office action dated May 16, 2018, issued in U.S. Appl. No. 15/657,299.
Office action dated Apr. 4, 2018, issued in U.S. Appl. No. 15/908,779.
Office action dated Jun. 21, 2018, issued in U.S. Appl. No. 15/959,534.
Chinese language office action dated Nov. 2, 2018, issued in application No. CN 201610156914.6.
Chinese language office action dated Nov. 1, 2018, issued in application No. CN 201610157140.9.
Office action dated Oct. 30, 2018, issued in U.S. Appl. No. 15/908,779.
Office action dated Nov. 29, 2018, issued in U.S. Appl. No. 15/973,552.

* cited by examiner

LIGHT EMITTING DEVICE

This application claims the benefit of U.S. provisional application Ser. No. 62/581,758, filed Nov. 5, 2017, the subject matter of which is incorporated herein by reference.

BACKGROUND OF THE INVENTION

Field of the Invention

The invention relates in general to a light emitting device, and more particularly to a light emitting device configured to increase the heat dissipation efficiency.

Description of the Related Art

Light emitting diode (LED) advantageously provides high brightness and consumes less power, and is durable and environmentally friendly. However, since part of the input power of the light emitting diode will be converted into heat energy, when the temperature of the light emitting diode is over 80° C., the light emitting performance will be greatly affected and the lifespan will be reduced. To increase the illumination efficiency of the light emitting diode, a heat dissipation module with better thermal performance is required to transfer the heat generated by the light emitting diode away from the light source, particularly the light emitting device with the double-sided light sources or multiple light sources.

SUMMARY OF THE INVENTION

The invention is directed to a light emitting device capable of transferring the heat to the exterior of the light emitting device via a heat dissipation substrate with higher heat dissipation efficiency.

The present invention provides a light emitting device including a first light emitting unit, a second light emitting unit, a heat dissipation substrate, a plurality of first bumps and a plurality of second bumps. The heat dissipation substrate is disposed between the first light emitting unit and the second light emitting unit. The first bumps are connected between the first light emitting unit and the heat dissipation substrate. The second bumps are connected between the second light emitting unit and the heat dissipation substrate.

In an embodiment, the first light emitting unit includes at least one first light emitting element, a first circuit substrate and a first package material. The first light emitting element is disposed on the first circuit substrate and covered by the first package material.

In an embodiment, the second light emitting unit includes at least one second light emitting element, a second circuit substrate and a second package material. The second light emitting element is disposed on the second circuit substrate and covered by the second package material.

In an embodiment, the heat dissipation substrate is received in a base having a connecting portion and a first opening region and a second opening region opposite to the first opening region. The first light emitting unit and the second light emitting unit are respectively exposed in the first opening region and the second opening region.

In an embodiment, the light emitting device further includes a plurality of fixing members configured to fix the heat dissipation substrate on the connecting portion. The first light emitting unit and the second light emitting unit transfer the heat to the connecting portion via the heat dissipation substrate.

In an embodiment, the heat dissipation substrate is a ceramic substrate or a metal core printed circuit board.

In an embodiment, the heat dissipation substrate has a metal core layer, via which the heats generated by the first light emitting element and the second light emitting element respectively are transferred to the connecting portion.

In an embodiment, the heat dissipation substrate further includes two metal block portions disposed on two opposite sides of the metal core layer. Two opposite surfaces of the two metal block portions are exposed.

In an embodiment, the two metal block portions and the metal core layer are formed of copper, aluminum or a combination thereof.

In an embodiment, the first bumps include at least one first heat conduction bump, and the second bumps includes at least one second heat conduction bump. The first heat conduction bump and the second heat conduction bump respectively contact the two metal block portions.

In an embodiment, the heat dissipation substrate includes a base, a plurality of first electrode pads, a plurality of second electrode pads and a plurality of through holes. The first electrode pads are disposed on the first surface of the base. The second electrode pads are disposed on the second surface of the base. The first electrode pads and the second electrode pads are electrically connected through the through holes passing through the base.

The present invention provides a light emitting device including a first light emitting unit, a second light emitting unit, a heat dissipation substrate and a plurality of through holes. The heat dissipation substrate is disposed between the first light emitting unit and the second light emitting unit. The through holes are disposed in the heat dissipation substrate. The first light emitting unit and the second light emitting unit are electrically connected through the through holes.

In an embodiment, the heat dissipation substrate includes a plurality of first electrode pads, a plurality of second electrode pads, a first annular metal layer and a second annular metal layer. The first electrode pads and the first light emitting unit are located in a first package area surrounded by the first annular metal layer. The second electrode pads and the second light emitting unit are located in a second package area surrounded by the second annular metal layer.

In an embodiment, the heat dissipation substrate further includes a positive voltage electrode and a negative voltage electrode, which are electrically connected to the first electrode pads through a first connection wire and a second connection wire respectively passing through the first annular metal layer.

In an embodiment, the light emitting device further includes a first package material and a second package material, which respectively cover the first package area surrounded by the first annular metal layer and the second package area surrounded by the second annular metal layer.

In an embodiment, the light emitting device further includes a first wavelength conversion layer and a second wavelength conversion layer, which respectively cover the first light emitting unit and the second light emitting unit.

In an embodiment, the light emitting device further includes a first adhesive resin and a second adhesive resin. The first adhesive resin at least partly covers the lateral surface of the first light emitting unit. The second adhesive resin at least partly covers the lateral surface of the second light emitting unit.

In an embodiment, the heat dissipation substrate is a ceramic substrate or a metal core printed circuit board.

In an embodiment, the heat dissipation substrate has a metal core layer, via which the heats generated by the first light emitting element and the second light emitting element respectively are transferred to an exterior of the light emitting device.

In an embodiment, the heat dissipation substrate includes a circuit substrate and a heat dissipation core plate. The heat dissipation core plate, disposed in an opening of the circuit substrate, is a ceramic substrate or a metal core printed circuit board.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements. Directional terms such as above, under, left, right, front or back are used in the following embodiments to indicate the directions of the accompanying drawings, not for limiting the present invention.

Figure 1A:
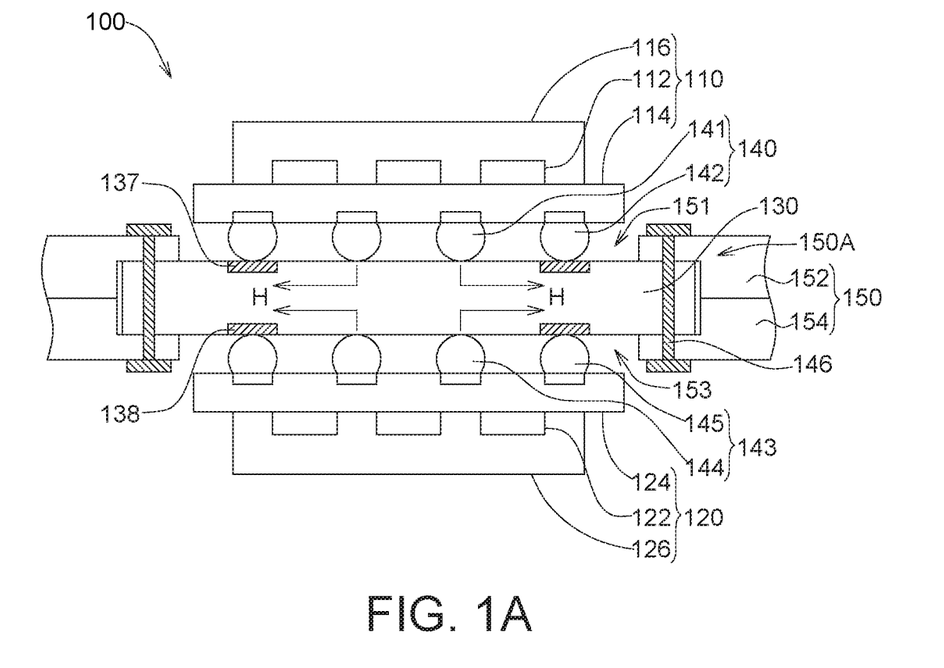
FIG. 1A is a schematic diagram of a light emitting device according to an embodiment of the present invention.

According to an embodiment of the present invention, a light emitting device is provided. The light emitting device is disposed on a base 150, such as a light stand of a vehicle lighting device. Refer to FIG. 1A. The light emitting device 100 includes a first light emitting unit 110, a second light emitting unit 120, a heat dissipation substrate 130, a plurality of first bumps 140 and a plurality of second bumps 143. The first bumps 140 and the second bumps 143 connect the first light emitting unit 110 and the second light emitting unit 120 to the heat dissipation substrate 130. A plurality of fixing members 146 fix the light emitting device 100 on the base 150.

The first light emitting unit 110 and the second light emitting unit 120 can be realized by light emitting diodes modules. The first light emitting unit 110 includes at least one first light emitting element 112, a first circuit substrate 114 and a first package material 116. The second light emitting unit 120 includes at least one second light emitting element 122, a second circuit substrate 124 and a second package material 126. The first light emitting element 112 is disposed on the first circuit substrate 114. The first package material 116 packages the first light emitting element 112 and the first circuit substrate 114, wherein the quantity of the first light emitting element 112 can be one or more than one, and is not limited to the illustration in the present embodiment. The first circuit substrate 114 can be realized by a copper clad laminate (CCL), a ceramic substrate, a metal core printed circuit board (MCPCB) or other carrier with conductive wires, but the present invention is not limited thereto. The structure and the material of the second light emitting unit 120 are similar to that of the first light emitting unit 110, and the similarities are not repeated here.

In the present embodiment, the first circuit substrate 114 and the second circuit substrate 124 can be realized by ceramic substrates. Since the ceramic substrate has high heat dissipation efficiency, the heat H generated by the first light emitting element 112 and the second light emitting element 122 can respectively be transferred to the heat dissipation substrate 130 via the first circuit substrate 114 and the second circuit substrate 124, such that the accumulation of the heat generated by the light emitting elements can be reduced and the illumination efficiency of light emitting element can be increased. The package material covers the light emitting elements to avoid the light emitting element being affected by the conditions of the external environment (such as moisture and temperature).

Refer to FIG. 1A. The first light emitting unit 110 and the second light emitting unit 120 share one heat dissipation substrate 130. The heat dissipation substrate 130 is disposed between the first light emitting unit 110 and the second light emitting unit 120. The first circuit substrate 114 is fixed on the first surface (such as the top surface) of the heat dissipation substrate 130 through the first bumps 140, and the second circuit substrate 124 is fixed on the second surface (such as the bottom surface) of the heat dissipation substrate 130 through the second bumps 143.

The first bumps 140 include at least one first heat conduction bump 141 configured to transfer the heat H generated by the first light emitting element 112 to the heat dissipation substrate 130. The first bumps 140 may further include at least one first electrode bump 142 configured to electrically connect a first electrode pad 137 disposed on the heat dissipation substrate 130. Moreover, the second bumps 143 include at least one second heat conduction bump 144 configured to transfer the heat H generated by the second light emitting element 122 to the heat dissipation substrate 130. The second bumps 143 may further include at least one second electrode bump 145 configured to electrically connect a second electrode pad 138 disposed on the heat dissipation substrate 130. The first bumps 140 and the second bumps 143 can be realized by solder bumps, unleaded bumps, gold bumps, or copper bumps, but the present invention is not limited thereto.

Refer to FIG. 1A. The heat dissipation substrate 130 is received in a base 150. The fixing members 146 are configured to fix two opposite sides of the heat dissipation substrate 130 on the base 150. In an embodiment, the base 150 has a connecting portion 150A. The connecting portion 150A can be formed by two components of the base 150, wherein the first component 152 has a first opening region 151, and the second component 154 has a second opening region 153. When the base 150 and the light emitting device 100 are not coupled together, the heat dissipation substrate 130 can be disposed between the first component 152 and the second component 154, and the two ends of the heat dissipation substrate 130 can be clamped by the first component 152 and the second component 154. The fixing members 146 sequentially pass through the heat dissipation substrate 130, the first component 152 and the second component 154 to fix the light emitting device 100 on the connecting portion 150A of the base 150, such that the first light emitting unit 110 and the second light emitting unit 120, which respectively are exposed from the first opening region 151 and the second opening region 153, can emit the light towards the upper side and the lower side of the base 150 and be used as a double-sided light source.

In the present embodiment, the fixing members 146 can be realized by screws, snap fasteners, rivets or other fastening structures, and the connecting portion 150A and the heat dissipation substrate 130 can have through holes allowing the fixing members 146 to pass through and fix the heat dissipation substrate 130 on the connecting portion 150A. However, in other embodiments of the present invention, the fixing members 146 are not limited to the illustration in the present embodiment. After the heat dissipation substrate 130 is fixed on the connecting portion 150A of the base 150, the first light emitting unit 110 and the second light emitting unit 120 can transfer the heat H to the connecting portion 150A through the heat dissipation substrate 130. Thus, the heat accumulation of the light emitting device 100 can be reduced, and the illumination efficiency of the light emitting device 100 can be increased.

Figure 2A:
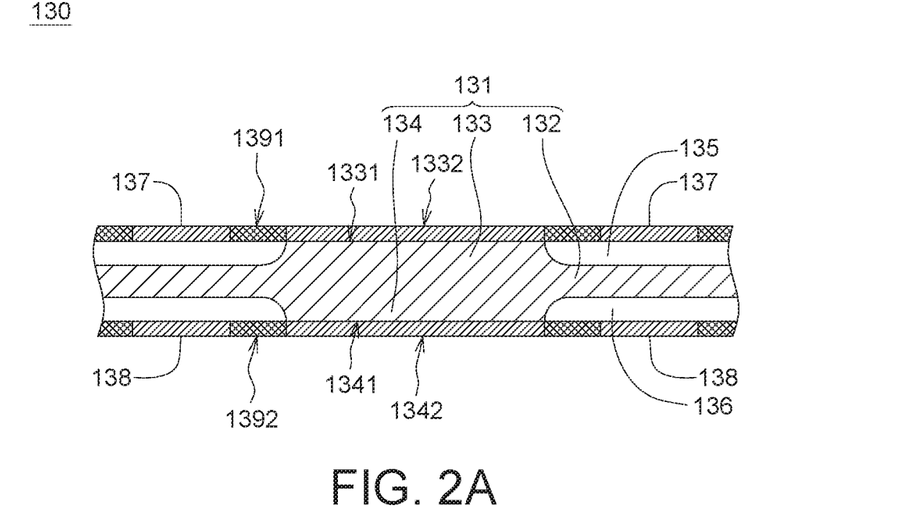
FIG. 2A is a schematic diagram of a heat dissipation substrate of the light emitting device of FIG. 1A.

Refer to FIGS. 1A and 2A. The heat dissipation substrate 130 of FIG. 2A is a cross-sectional view of a heat dissipation substrate 130 of the light emitting device 100 of FIG. 1A. In an embodiment, the heat dissipation substrate 130 can be realized by a metal core printed circuit board (MCPCB) or other carrier with high heat dissipation. Let a double-sided copper core substrate be taken for example. The heat dissipation substrate 130 includes a metal core layer 131, a patterned first insulation layer 135, a patterned second insulation layer 136, a plurality of first electrode pads 137, a plurality of second electrode pads 138, a patterned first solder mask layer 1391 and a patterned second solder mask layer 1392. The metal core layer 131 has a core portion 132, a first metal block portion 133 and a second metal block portion 134, which can be integrally formed in one piece, wherein the first metal block portion 133 and the second metal block portion 134 are respectively located on the upper side and the lower side of the core portion 132. The patterned first insulation layer 135 and the patterned second insulation layer 136 cover the peripheral of the upper side and the lower side of the metal core layer 131 but expose the top surface 1331 of the first metal block portion 133 and the bottom surface 1341 of the second metal block portion 134. Additionally, the first electrode pads 137 are disposed on the patterned first insulation layer 135; the first solder mask layer 1391 covers the patterned first insulation layer 135 but exposes the first electrode pads 137. Besides, the second electrode pads 138 are disposed on the patterned second insulation layer 136; the second solder mask layer 1392 covers the patterned second insulation layer 136 but exposes the second electrode pads 138.

Refer to FIG. 2A. In an embodiment, the core portion 132 of the metal core layer 131 extends to the two sides from the center along a horizontal direction; the first metal block portion 133 and the second metal block portion 134 are respectively protruded from the upper side and the lower side of the core portion 132. As indicated in FIG. 1A, the heat H generated by the first light emitting element 112 and the second light emitting element 122 can be transferred to the core portion 132 via the first heat conduction bumps 141 and the first metal block portion 133 as well as the second heat conduction bumps 144 and the second metal block portion 134, wherein the first heat conduction bumps 141 and the first metal block portion 133 contact each other; the second heat conduction bumps 144 and the second metal block portion 134 contact each other. Then, the heat H is further transferred to the connecting portion 150A disposed on the two sides of the heat dissipation substrate 130 from the core portion 132 to increase the heat dissipation efficiency. In an embodiment, the top surface 1331 of the first metal block portion 133 and the bottom surface 1341 of the second metal block portion 134 respectively can have a first antioxidant layer 1332 and a second antioxidant layer 1342 disposed thereon. The first antioxidant layer 1332 and the second antioxidant layer 1342 can be formed of gold or silver.

Figure 2B:
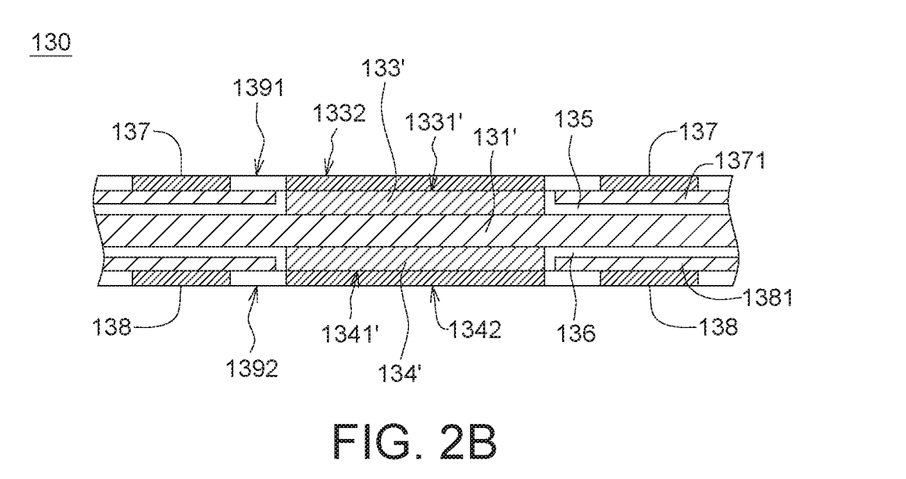
FIG. 2B is a schematic diagram of a heat dissipation substrate of the light emitting device of FIG. 1A.

Refer to FIGS. 1A and 2B. The heat dissipation substrate 130 of FIG. 2B is a cross-sectional view of the heat dissipation substrate 130 of the light emitting device 100 of FIG. 1A according to another embodiment. In another embodiment, the heat dissipation substrate 130 includes a metal core layer 131', a first metal block 133', a second metal block 134', a patterned first insulation layer 135, a patterned second insulation layer 136, a first conductive layer 1371, a second conductive layer 1381, at least one first electrode pad 137, at least one second electrode pads 138, a patterned first solder mask layer 1391 and a patterned second solder mask layer 1392. The metal core layer 131' is disposed between the first metal block 133' and the second metal block 134'. The patterned first insulation layer 135 and the patterned second insulation layer 136 cover the peripheral of the upper side and the lower side of the metal core layer 131' but expose the top surface 1331' of the first metal block 133' and the bottom surface 1341' of the second metal block 134'. Furthermore, the first electrode pads 137 are disposed on the first conductive layer 1371; the patterned first solder mask layer 1391 covers the first conductive layer 1371 but exposes the first electrode pads 137. Besides, the second electrode pads 138 are disposed on the second conductive layer 1381; the patterned second solder mask layer 1392 covers the second conductive layer 1381 but exposes the second electrode pads 138.

Refer to FIG. 2B. In an embodiment, the metal core layer 131' extends to the two sides from the center along a horizontal direction; the first metal block 133' and the second metal block 134' respectively are protruded from the upper side and the lower side of the metal core layer 131'. As indicated in FIG. 1A, the heat H generated by the first light emitting element 112 and the second light emitting element 122 can be transferred to the metal core layer 131' via the first heat conduction bumps 141 and the first metal block 133' as well as the second heat conduction bumps 144 and the second metal block 134', wherein the first heat conduction bumps 141 and the first metal block 133' contact each other; the second heat conduction bumps 144 and the second metal block 134' contact each other. Then, the heat H is further transferred to the two sides of the heat dissipation substrate 130 from the metal core layer 131' to increase the heat dissipation efficiency. In an embodiment, the top surface 1331' of the first metal block 133' and the bottom surface 1341' of the second metal block 134' respectively can have a first antioxidant layer 1332 and a second antioxidant layer 1342 disposed thereon. The first antioxidant layer 1332 and the second antioxidant layer 1342 can be formed of gold or silver. Moreover, the first metal block 133', the second metal block 134' and the metal core layer 131' can be formed of copper, aluminum or a combination thereof.

Figure 1B:
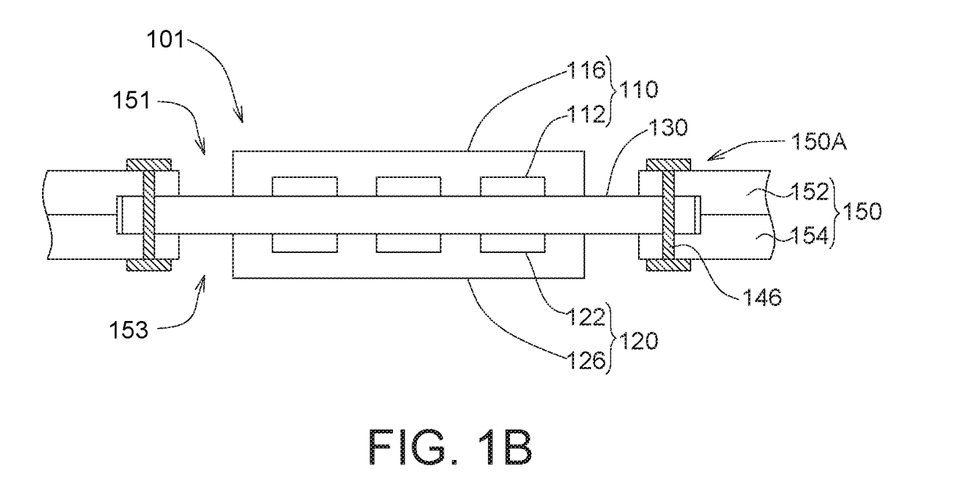
FIG. 1B is a schematic diagram of a light emitting device according to another embodiment of the present invention.

According to another embodiment of the present invention, a light emitting device is provided. Refer to FIG. 1B. The light emitting device 101 includes a first light emitting unit 110, a second light emitting unit 120, a heat dissipation substrate 130 and a plurality of fixing members 146. The light emitting device 101 of the present embodiment is similar to the light emitting device 100 of the above embodiment, and identical designations are used to indicate identical elements. The present embodiment is different from the above embodiment in that: the first light emitting unit 110 and the second light emitting unit 120 can be directly disposed on the heat dissipation substrate 130 without going through a circuit substrate.

The first light emitting unit 110 and the second light emitting unit 120 can be realized by light emitting diodes modules. The first light emitting element 112 is disposed on the first surface (such as the top surface) of the heat dissipation substrate 130. The second light emitting element 122 is disposed on the second surface (such as the bottom surface) of the heat dissipation substrate 130. The heat dissipation substrate 130 can be realized by a ceramic substrate, a metal core printed circuit board (MCPCB) or other carrier with conductive wires, but the present invention is not limited thereto.

As indicated in FIG. 1B, the heat dissipation substrate 130 is received in a base 150, and the fixing members 146 is configured to fix two opposite sides of the heat dissipation substrate 130 on the connecting portion 150A of the base 150, such that the first light emitting unit 110 and the second light emitting unit 120 are respectively exposed in a first opening region 151 and a second opening region 153 of the base 150 and can be used as a double-sided light source.

Figure 3A:
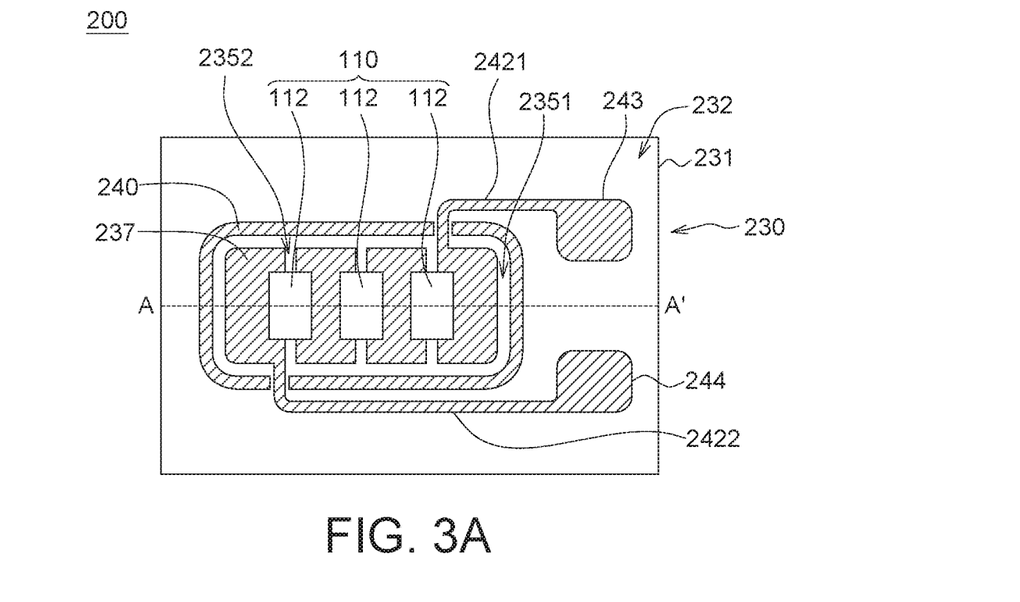
FIGS. 3A and 3B respectively a front view and a rear view of a light emitting device according to an embodiment of the present invention.
Figure 3B:
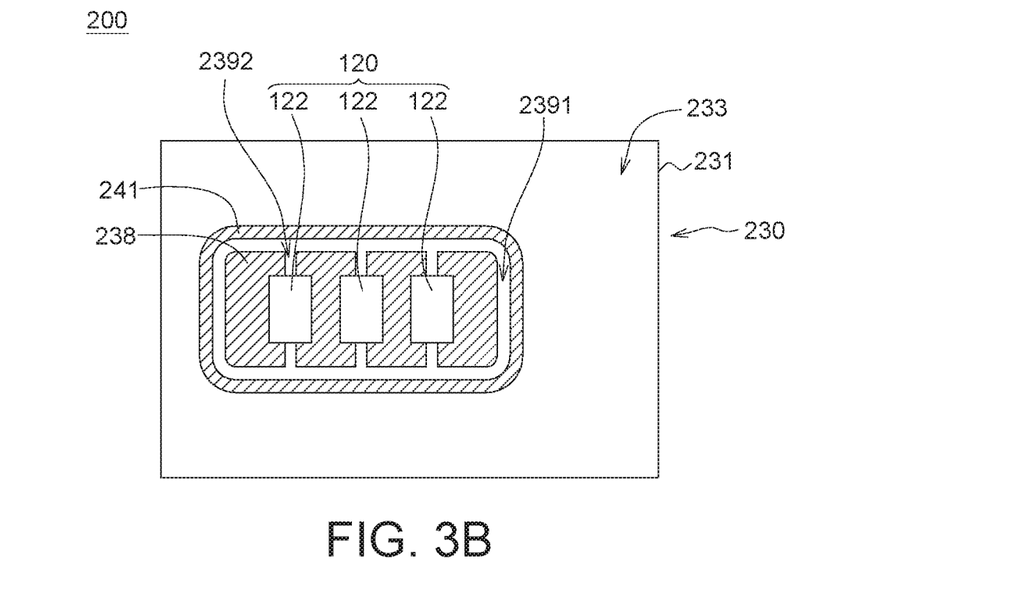
Figure 4A:
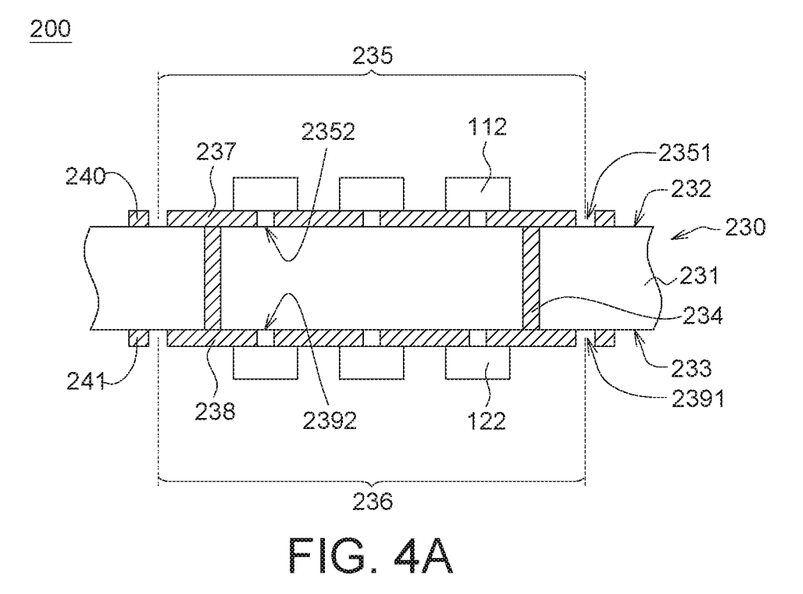
FIG. 4A is a cross-sectional view of the light emitting device of FIG. 3A along a cross-sectional line A-A'.

Refer to FIGS. 3A, 3B and 4A. FIGS. 3A and 3B respectively a front view and a rear view of a light emitting device 200 according to an embodiment of the present invention. FIG. 4A is a cross-sectional view of the light emitting device 200 of FIG. 3A along a cross-sectional line A-A'. The light emitting device 200 includes a first light emitting unit 110, a second light emitting unit 120 and a heat dissipation substrate 230. The heat dissipation substrate 230 can be used as the heat dissipation substrate 130 in FIG. 1B.

The heat dissipation substrate 230 includes a base 231, a plurality of first electrode pads 237, a plurality of second electrode pads 238 and a plurality of through holes 234. The first electrode pads 237 are disposed on the first surface 232 of the base 231. The second electrode pads 238 are disposed on the second surface 233 of the base 231. The first electrode pads 237 and the second electrode pads 238 are electrically connected through the through holes 234 passing through the base 231. The first light emitting unit 110 includes at least one first light emitting element 112 electrically connected to the first electrode pads 237 disposed on the first surface 232 of the heat dissipation substrate 230. The second light emitting unit 120 includes at least one second light emitting element 122 electrically connected to the second electrode pads 238 disposed on the second surface 233 of the heat dissipation substrate 230. The through holes 234 pass through the base 231 and are electrically connected between the first electrode pads 237 and the second electrode pads 238.

In an embodiment, the heat dissipation substrate 230 may further include a first annular metal layer 240 and a second annular metal layer 241, which are respectively configured to surround a first package area 235 and a second package area 239. The first electrode pads 237 and the first light emitting elements 112 are located in the first package area 235, wherein the first electrode pads 237 are separated from each other by a plurality of first spaced trenches 2352, and each first light emitting element 112 crosses over a corresponding first spaced trench 2352 and is electrically connected to two adjacent first electrode pads 237 to form a first series circuit. Additionally, the second electrode pads 238 and the second light emitting elements 122 are located in the second package area 239, wherein the second electrode pads 238 are separated from each other by a plurality of second spaced trenches 2392, and each second light emitting element 122 crosses over a corresponding first spaced trench 2392 and is electrically connected to two adjacent second electrode pads 238 to form a second series circuit.

Refer to FIG. 3A. In the present embodiment, the heat dissipation substrate 230 may further include a positive voltage electrode 243 and a negative voltage electrode 244 respectively connected to the first series circuit and the second series circuit to receive a positive voltage and a negative voltage from a power. The positive voltage electrode 243 and the negative voltage electrode 244 can be disposed on the first surface 232 of the heat dissipation substrate 230 and electrically connected to two separated first electrode pads 237 through a first connection wire 2421 and a second connection wire 2422 passing through the first annular metal layer 240 respectively. In another embodiment (not illustrated in the diagram), the positive voltage electrode 243 and the negative voltage electrode 244 can respectively be disposed on the second surface 233 of the heat dissipation substrate 130 and electrically connected to two separated second electrode pads 238 through two connection wires passing through the second annular metal layer 241.

Figure 4B:
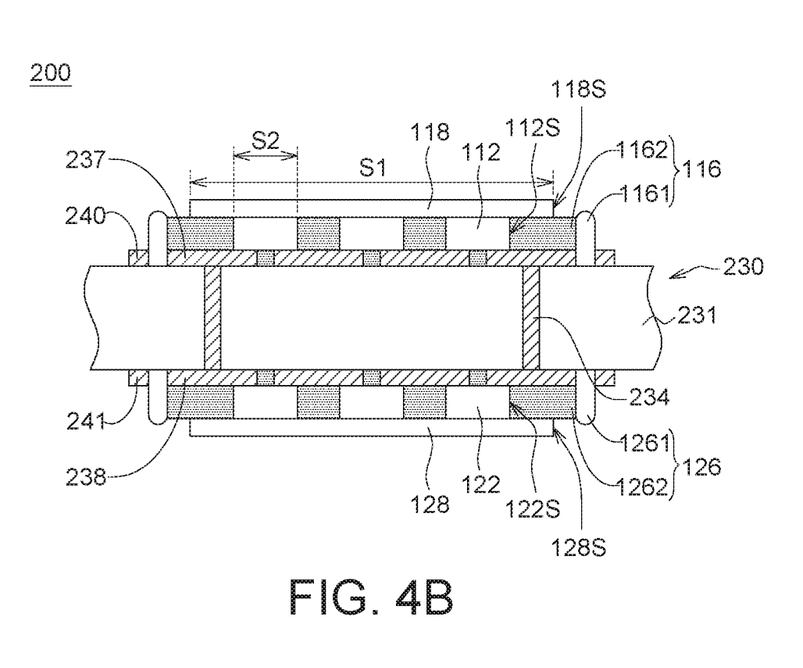
FIG. 4B is a cross-sectional view of a light emitting device according to an embodiment of the present invention.

Refer to FIG. 4B. In another embodiment, the two package areas disposed on the upper side and the lower side of the heat dissipation substrate 230 and may further include a first package material 116 and a second package material 126 therein respectively. Each package material respectively has a first sealant 1161 and a second sealant 1162. On the first surface 232 of the heat dissipation substrate 230, at least part of the first sealant 1161 is disposed in the first trench 2351 and surrounds the first electrode pads 237 and the first light emitting elements 112. The second sealant 1162 is located on the first electrode pads 237 and inside the first spaced trenches 2352, and covers the first light emitting elements 112. Also, on the second surface 233 of the heat dissipation substrate 230, at least part of the first sealant 1261 is disposed inside the second trench 2391 and surrounds the second electrode pads 238 and the second light emitting elements 122. The second sealant 1162 is located on the second electrode pads 238 and inside the second spaced trenches 2392, and covers the second light emitting elements 122.

The first sealant 1161 and the second sealant 1162 can be formed of a thermosetting polymer material such as epoxy resin. Firstly, the semi-cured first sealant 1161 is filled to the first trench 2351 and the second trench 2391 and is heat-cured to form a close or an open annular dam. Then, the semi-cured second sealant 1162 is respectively filled to the space surrounded by the first sealant 1161 on the upper surface and the lower surface of the heat dissipation substrate 230 to cover the peripheral of the first light emitting element 112 and the second light emitting element 122, and is then heat-cured. In the above filling process, the first sealant 1161 and the second sealant 1162 are formed and heat-cured on the first surface 232 of the heat dissipation substrate 230. Then, another first sealant 1161 and another second sealant 1162 are formed and heat-cured on the second surface 233 of the heat dissipation substrate 230.

Refer to FIG. 4B. In an embodiment, the light emitting device 200 may further include a first wavelength conversion layer 118 and a second wavelength conversion layer 128. The first wavelength conversion layer 118 is disposed on the first light emitting elements 112. The second wavelength conversion layer 128 is disposed on the second light emitting elements 122. The first wavelength conversion layer 118 can completely cover the top surface of the first light emitting element 112. That is, in the present embodiment, the horizontal dimension S1 of the first wavelength conversion layer 118 is relatively larger than the horizontal dimension S2 of the first light emitting element 112. Furthermore, the second wavelength conversion layer 128 can partly cover the top surface of the second light emitting element 122. That is, in the present embodiment, the horizontal dimension S1 of the second wavelength conversion layer 128 is relatively larger than the horizontal dimension S2 of the second light emitting element 122. That is, the lateral surface 118S of the first wavelength conversion layer 118 extends over the lateral surface 112S of the first light emitting element 112, and the lateral surface 128S of the second wavelength conversion layer 128 extends over the lateral surface 122S of the second light emitting element 122.

In an embodiment, wavelength conversion layer can be formed of a phosphor material such as sulfide, yttrium aluminum garnet (YAG), LuAG, silicate, nitride, oxynitride, fluoride, TAG, KSF, or KTF.

In an embodiment, the second sealant 1162 can be formed of a light reflective material, and the second sealant 1162 can reflect at least part of light emitted from the lateral surface of the light emitting elements 112 and 122 to the wavelength conversion layers 118 and 128, such that the light extraction efficiency of the light emitting device 100 can be increased. In an embodiment, the second sealant 1162 also extends to the lateral surface of the wavelength conversion layers 118 and 128, such that the top surface of the wavelength conversion layers 118 and 128 can be substantially flushed with the top surface of the second sealant 1162 as indicated in FIG. 4C.

Figure 4C:
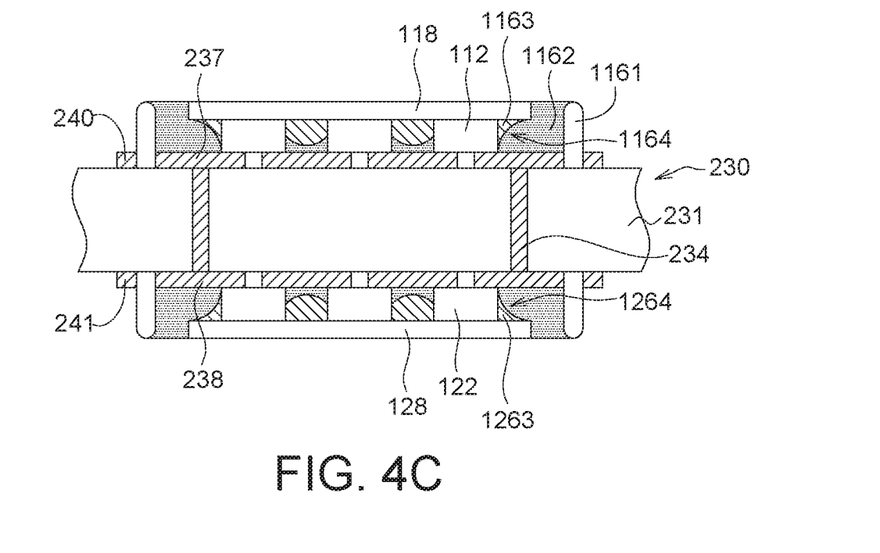
FIG. 4C is a cross-sectional view of a light emitting device according to another embodiment of the present invention.

Refer to FIG. 4C. In an embodiment, a first adhesive resin 1163 can be formed on the top surface of the first light emitting elements 112 using coating or dispensing technology. Then, the first wavelength conversion layer 118 is disposed on the first adhesive resin 1163. When the first adhesive resin 1163 is squeezed by the first wavelength conversion layer 118, the first adhesive resin 1163 flows towards the two sides of the first light emitting element 112 and forms a first side portion 1164. The first side portion 1164 forms a concave surface due to the surface tension which occurs when the resin is dried and cured. The first side portion 1164 at least partly covers the lateral surfaces 112S of the first light emitting element 112. Besides, the second sealant 1162 covers the peripheral of the first side portion 1164, and therefore forms a convex surface towards the first light emitting element 112 in correspondence to the concave surface. The convex surface of the second sealant 1162 can reflect at least part of the light emitted from the lateral surface of the first light emitting element 112 to the first wavelength conversion layer 118, such that the light extraction efficiency of the light emitting device 200 can be increased.

Similarly, as indicated in FIG. 4C, a second adhesive resin 1263 can be formed on the top surface of the second light emitting elements 122 using coating or dispensing technology. Then, the second wavelength conversion layer 128 is disposed on the second adhesive resin 1163. When the second adhesive resin 1163 is squeezed by the second wavelength conversion layer 128, the second adhesive resin 1163 flows towards the two sides of the second light emitting element 122 and forms a second side portion 1264. The second side portion 1264 forms a concave surface due to the surface tension which occurs when the resin is dried and cured. The second side portion 1264 at least partly covers the lateral surface 122S of the second light emitting element 122. Also, the second sealant 1162 covers the peripheral of the second side portion 1264, and therefore forms a convex surface towards the second light emitting element 122 in correspondence to the concave surface. The convex surface of the second sealant 1162 can reflect at least part of the light emitted from the lateral surface of the second light emitting element 122 to the second wavelength conversion layer 128, such that the light extraction efficiency of the light emitting device 200 can be increased.

Figure 4D:
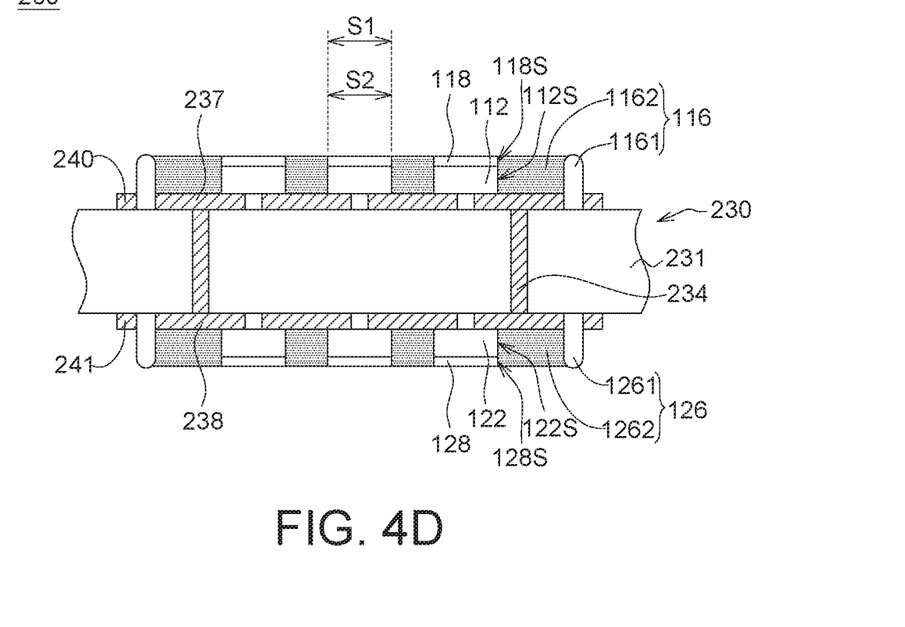
FIG. 4D is a cross-sectional view of a light emitting device according to another embodiment of the present invention.

Refer to FIG. 4D. In an embodiment, the lateral dimension S1 of the first wavelength conversion layer 118 is substantially equivalent to the lateral dimension S2 of the first light emitting element 112. That is, the lateral surface 118S of the first wavelength conversion layer 118 is substantially flushed with the lateral surface 112S of the first light emitting element 112. Similarly, the lateral surface of the second wavelength conversion layer 128 is flushed with the lateral surface 122S of the second light emitting element 122. Although it is not illustrated in the diagram, in another embodiment, the lateral dimension of the wavelength conversion layer can be smaller than I the lateral dimension of the light emitting element. That is, the wavelength conversion layer only covers a part of the top surface of the light emitting element, such that the lateral surface of the wavelength conversion layer is indented within the lateral surface of the light emitting element.

In an embodiment, the base 231 of the heat dissipation substrate 230 can be formed of a ceramic material such as aluminum nitride or aluminum oxide. Although it is not illustrated in the diagram, the light emitting elements 112 and 122 may include a first type semiconductor layer, a second type semiconductor layer, and a light emitting layer disposed between the first type semiconductor layer and the second type semiconductor layer. The first type semiconductor layer can be realized by an N type semiconductor layer, and the second type semiconductor layer can be realized by a P type semiconductor layer. The light emitting elements 112 and 122 can be fixed on the electrode pads using a flip chip method. The base 231 of the heat dissipation substrate 230 is formed of a ceramic material, and therefore has a coefficient of thermal expansion similar to that of the light emitting elements 112 and 122. Therefore, the light emitting elements 112 and 122 will not be damaged by the thermal stress, the packaging reliability of the light emitting elements can be increased, the heat generated by the light emitting element can be quickly transferred via the heat dissipation substrate 230, and the heat accumulation of the light emitting elements can be reduced.

The first annular metal layer 240, the second annular metal layer 241, the first electrode pads 237, and the second electrode pads 238 formed of copper can be realized by such as patterned copper layers. In some embodiments, the heat dissipation substrate 230 may further include a plated layer (not illustrated in the diagram) formed on the patterned copper layer to avoid the copper layer being oxidized.

In an embodiment, the wavelength conversion layer can be formed on the top surface of the light emitting elements using a spraying method or by bonding a fluorescent film on the top surface. When the spraying method is used, the wavelength conversion layer can be more conformally formed on the light emitting elements.

Figure 5A:
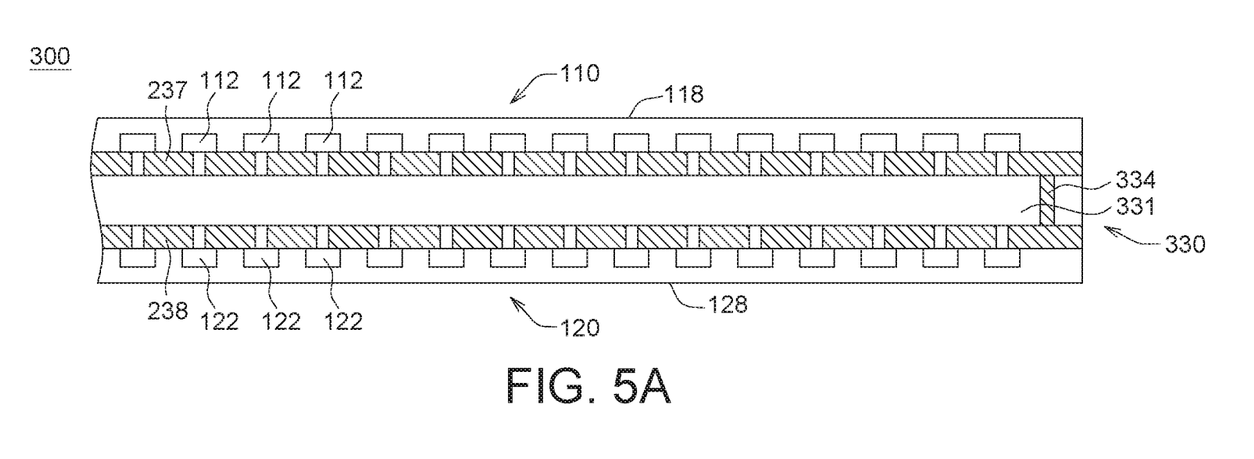
FIG. 5A is a cross-sectional view of a light emitting device according to an embodiment of the present invention.
Figure 5B:
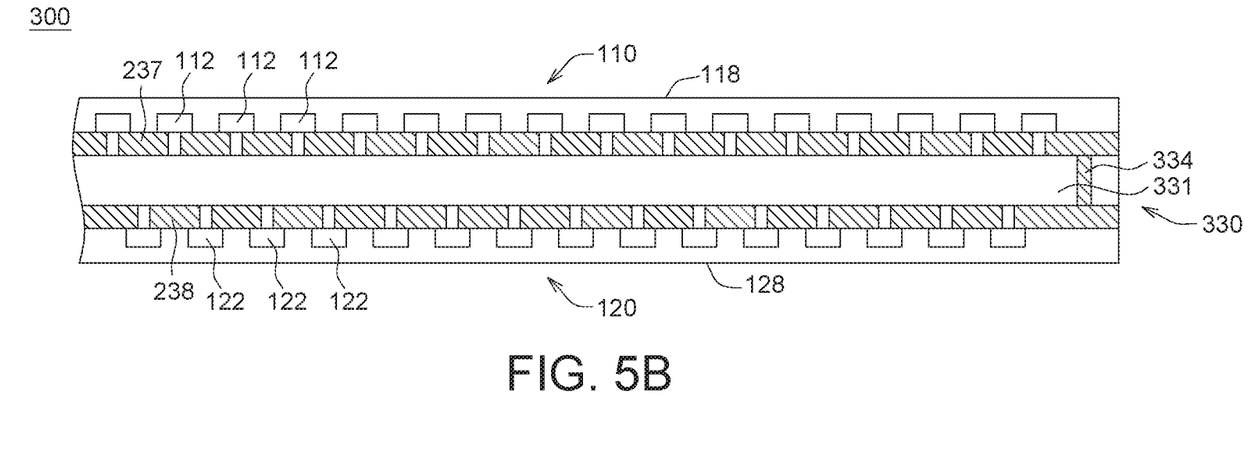
FIG. 5B is a side view of a light emitting device according to another embodiment of the present invention.

According to an embodiment of the present invention, a light emitting device is provided and used as a filament light source formed of series of light emitting diodes. Refer to FIGS. 5A and 5B. The light emitting device 300 includes a first light emitting unit 110, a second light emitting unit 120 and a heat dissipation substrate 330. The first light emitting unit 110 includes a plurality of first light emitting elements 112. The second light emitting unit 120 includes a plurality of second light emitting elements 122. The first light emitting elements 112 are disposed on the first electrode pads 237 of the heat dissipation substrate 330 in series to form a first series circuit. The second light emitting elements 122 are disposed on the second electrode pads 238 of the heat dissipation substrate 330 in series to form a second series circuit. Besides, the first series circuit and the second series circuit can be electrically connected through the through holes 334 passing through the base 331 of the heat dissipation substrate 330. Although it is not illustrated in the diagram, in the present embodiment, the heat dissipation substrate 330 may further include a positive electrode pads and a negative electrode pads, which are respectively connected to the first series circuit and the second series circuit to receive a positive voltage and a negative voltage from a power. The light emitting device 300 of FIG. 5A is similar to that of FIG. 5B except that in FIG. 5A, the first light emitting elements 112 and the second light emitting elements 122 are vertically aligned, but in FIG. 5B, the first light emitting elements 112 and the second light emitting elements 122 are vertically staggered.

Furthermore, the light emitting device 300 may further include a first wavelength conversion layer 118 and a second wavelength conversion layer 128. The first wavelength conversion layer 118 is disposed on the first light emitting elements 112. The second wavelength conversion layer 128 is disposed on the second light emitting elements 122. The first wavelength conversion layer 118 can cover the surface of all first light emitting elements 112 using spraying or dispensing method, and the second wavelength conversion layer 128 can cover the surface of all second light emitting elements 122 using a spraying or dispensing method.

In an embodiment, the base 331 of the heat dissipation substrate 230 can be formed of a ceramic material such as aluminum nitride or aluminum oxide. In another embodiment, the base 331 can be realized by a metal core printed circuit board (MCPCB) or other carrier with conductive wires to increase the heat dissipation effect.

Figure 6A:
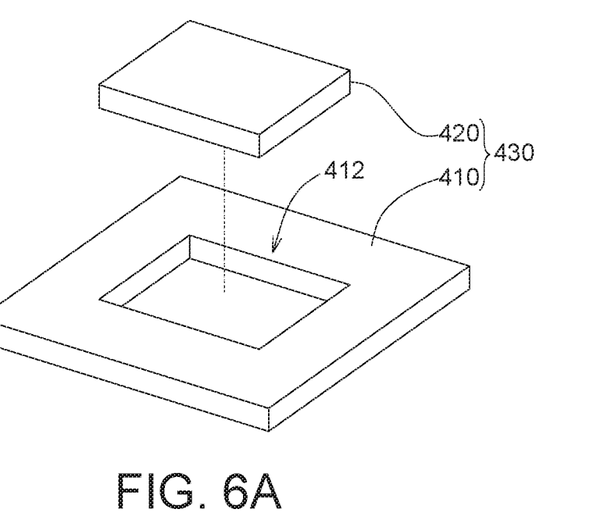
FIGS. 6A and 6B are manufacturing processes of a manufacturing method of a light emitting device according to an embodiment of the present invention.
Figure 6B:
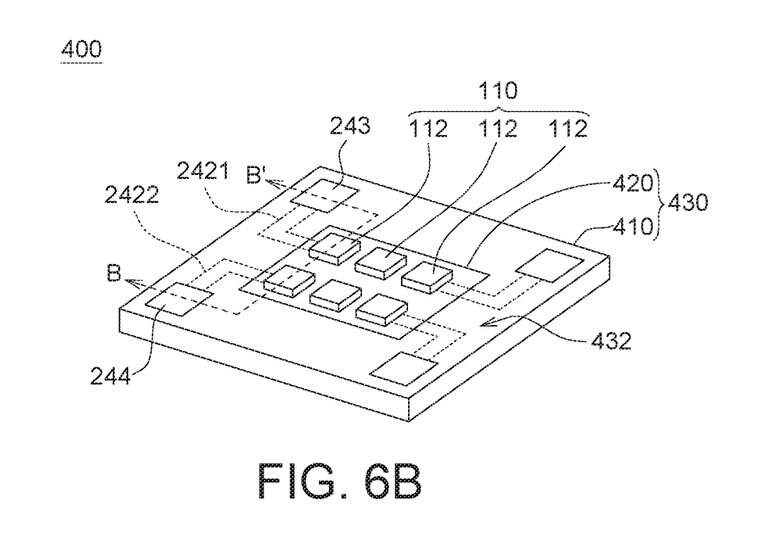

According to an embodiment of the present invention, another light emitting device 400 is provided. Refer to FIGS. 6A and 6B. The light emitting device 400 includes a circuit substrate 410, a heat dissipation core plate 420 and a first light emitting unit 110. The circuit substrate 410 has an opening 412 configured to receive the heat dissipation core plate 420 to form a heat dissipation substrate 430. The circuit substrate 410 can be realized by a printed circuit board or other carrier with conductive wires. The heat dissipation core plate 420 can be realized by a ceramic substrate, a copper core substrate or a metal core printed circuit board (MCPCB). The circuit substrate 410 and the heat dissipation core plate 420 can be connected through an insulation layer to fix the heat dissipation core plate 420 in the circuit substrate 410. Also, the first light emitting unit 110 includes at least one first light emitting element 112, which can be electrically connected through the electrode pads manufactured in successive process to form a first series circuit. The positive voltage electrode 243 and the negative voltage electrode 244 can be disposed on the first surface 232 of the heat dissipation substrate 230, and can be electrically connected to the first electrode pads through a first connection wire 2421 and a second connection wire 2422 respectively.

Figure 7:
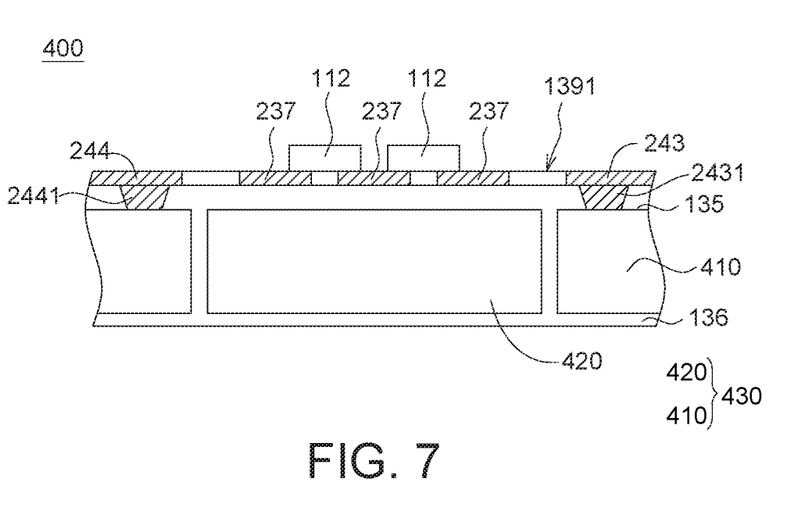
FIG. 7 is a cross-sectional view of the light emitting device of FIG. 6B along a cross-sectional line B-B'.

Referring to FIG. 7, a cross-sectional view of the light emitting device 400 of FIG. 6B along a cross-sectional line B-B'. The patterned first insulation layer 135 and the patterned second insulation layer 136 cover the circuit substrate 410 and the heat dissipation core plate 420. At least one first electrode pad 237 and a patterned first solder mask layer 1391 are formed on the patterned first insulation layer 135. The patterned first solder mask layer 1391 covers the patterned first insulation layer 135 but exposes the first electrode pads 237. Besides, the light emitting device 400 may further include at least one positive voltage electrode 243 and at least one negative voltage electrode 244, which are respectively disposed on the first insulation layer 135 and connected to the first series circuit to receive a positive voltage and a negative voltage from a power. Additionally, the positive voltage electrode 243 and the negative voltage electrode 244 can be electrically connected to the circuit substrate 410 through the conducting holes 2441 and 2431 and can be aligned with the positive voltage electrode 243 and the negative voltage electrode 24 respectively. The heat dissipation substrate 430 of FIG. 6A, FIG. 6B and FIG. 7 can be used as the heat dissipation substrate 230 of the double-sided light emitting device 200 of FIG. 4A to FIG. 4D or the heat dissipation substrate 130 of the double-sided light emitting device 101 of FIG. 1B.

Refer to FIG. 6B. Since the heat dissipation core plate 420 is fixed in the circuit substrate 410, the first light emitting unit 110 can transfer the heat to the exterior via the heat dissipation core plate 420, such that the heat accumulation of the light emitting device 400 can be reduced and the illumination efficiency of the light emitting device 400 can be increased.

According to the light emitting device disclosed in above embodiments of the present invention, the heat can be transferred to the exterior via the heat dissipation substrate of higher heat dissipation efficiency to avoid the heat accumulation of the light emitting elements, such that the light emitting performance of light emitting elements can be improved, and the lifespan of the light emitting elements can be prolonged.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting device, comprising:
a first light emitting unit;
a second light emitting unit;
a heat dissipation substrate disposed between the first light emitting unit and the second light emitting unit; and
a plurality of through holes disposed in the heat dissipation substrate, wherein the first light emitting unit and the second light emitting unit are electrically connected through the through holes, wherein the heat dissipation substrate comprises a plurality of first electrode pads, a plurality of second electrode pads, a first annular metal layer and a second annular metal layer, the first electrode pads and the first light emitting unit are located in a first package area surrounded by the first annular metal layer, and the second electrode pads and the second light emitting unit are located in a second package area surrounded by the second annular metal layer, wherein the heat dissipation substrate further comprises a positive voltage electrode and a negative voltage electrode, which respectively are electrically connected to the first electrode pads through a first connection wire and a second connection wire passing through the first annular metal layer.

2. The light emitting device according to claim 1, further comprising a first package material and a second package material, which respectively cover the first package area surrounded by the first annular metal layer and the second package layer surrounding by the second annular metal layer.

3. The light emitting device according to claim 1, further comprising a first wavelength conversion layer and a second wavelength conversion layer, which respectively cover the first light emitting unit and the second light emitting unit.

4. The light emitting device according to claim 3, wherein the first light emitting unit comprises a plurality of first light emitting elements, a first sealant and a second sealant, the first light emitting elements are surrounded by the first sealant, and the second sealant is disposed in a first trench surrounding the plurality of first electrode pads.

5. The light emitting device according to claim 4, wherein a top surface of the first wavelength conversion layer is substantially flushed with a top surface of the first sealant.

6. The light emitting device according to claim 4, wherein a horizontal dimension of the first wavelength conversion layer is substantially equivalent to a horizontal dimension of each of the first light emitting elements.

7. The light emitting device according to claim 4, wherein the first sealant is formed of a light reflective material.

8. The light emitting device according to claim 3, wherein the second light emitting unit comprises a plurality of second light emitting elements, a first sealant and a second sealant, the second light emitting elements are surrounded by the first sealant, and the second sealant is disposed in a trench surrounding the plurality of second electrode pads.

9. The light emitting device according to claim 8, wherein a top surface of the second wavelength conversion layer is substantially flushed with a top surface of the second sealant.

10. The light emitting device according to claim 8, wherein a horizontal dimension of the second wavelength conversion layer is substantially equivalent to a horizontal dimension of each of the second light emitting elements.

11. The light emitting device according to claim 8, wherein the first sealant is formed of a light reflective material.

12. A light emitting device, comprising:
a first light emitting unit;
a second light emitting unit;
a heat dissipation substrate disposed between the first light emitting unit and the second light emitting unit;
a plurality of through holes disposed in the heat dissipation substrate, wherein the first light emitting unit and the second light emitting unit are electrically connected through the through holes, wherein the heat dissipation substrate comprises a plurality of first electrode pads, a plurality of second electrode pads, a first annular metal layer and a second annular metal layer, the first electrode pads and the first light emitting unit are located in a first package area surrounded by the first annular metal layer, and the second electrode pads and the second light emitting unit are located in a second package area surrounded by the second annular metal layer; and
a first wavelength conversion layer and a second wavelength conversion layer, which respectively cover the first light emitting unit and the second light emitting unit,
wherein the first light emitting unit comprises a plurality of first light emitting elements, a first sealant and a second sealant, the first light emitting elements are surrounded by the first sealant, and the second sealant is disposed in a first trench surrounding the plurality of first electrode pads.

13. The light emitting device according to claim 12, further comprising a first package material and a second package material, which respectively cover the first package area surrounded by the first annular metal layer and the second package layer surrounding by the second annular metal layer.

14. The light emitting device according to claim 12, wherein a top surface of the first wavelength conversion layer is substantially flushed with a top surface of the first sealant.

15. The light emitting device according to claim 12, wherein a horizontal dimension of the first wavelength conversion layer is substantially equivalent to a horizontal dimension of each of the first light emitting elements.

16. The light emitting device according to claim 12, wherein the first sealant is formed of a light reflective material.

17. The light emitting device according to claim 12, wherein the second light emitting unit comprises a plurality of second light emitting elements, a first sealant and a second sealant, the second light emitting elements are surrounded by the first sealant, and the second sealant is disposed in a trench surrounding the plurality of second electrode pads.

18. The light emitting device according to claim 17, wherein a top surface of the second wavelength conversion layer is substantially flushed with a top surface of the second sealant.

19. The light emitting device according to claim 17, wherein a horizontal dimension of the second wavelength conversion layer is substantially equivalent to a horizontal dimension of each of the second light emitting elements.

20. The light emitting device according to claim 17, wherein the first sealant is formed of a light reflective material.

* * * * *